United States Patent
Chun et al.

(10) Patent No.: US 10,482,943 B2
(45) Date of Patent: Nov. 19, 2019

(54) SYSTEMS AND METHODS FOR IMPROVED ERROR CORRECTION IN A REFRESHABLE MEMORY

(71) Applicant: QUALCOMM INCORPORATED, San Diego, CA (US)

(72) Inventors: Dexter Chun, San Diego, CA (US); Yanru Li, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 15/636,565

(22) Filed: Jun. 28, 2017

(65) Prior Publication Data

US 2019/0006001 A1   Jan. 3, 2019

(51) Int. Cl.
| | | |
|---|---|---|
| G11C 7/00 | (2006.01) | |
| G11C 11/406 | (2006.01) | |
| H01L 27/108 | (2006.01) | |
| H03M 13/09 | (2006.01) | |
| H03M 13/11 | (2006.01) | |

(52) U.S. Cl.
CPC .. *G11C 11/40607* (2013.01); *G11C 11/40615* (2013.01); *G11C 2211/4062* (2013.01); *H01L 27/10894* (2013.01); *H03M 13/098* (2013.01); *H03M 13/11* (2013.01)

(58) Field of Classification Search
CPC ........ G11C 11/40607; G11C 11/40615; G11C 2211/4062
USPC ........................................ 365/222, 200, 201
See application file for complete search history.

(56) References Cited

U.S. PATENT DOCUMENTS

| | | | |
|---|---|---|---|
| 8,621,324 B2 | 12/2013 | Suh | |
| 8,874,996 B2 | 10/2014 | Jung | |
| 9,053,813 B2 | 6/2015 | Kang et al. | |
| 9,472,261 B1* | 10/2016 | Chun | G11C 29/023 |
| 9,583,219 B2 | 2/2017 | Kim et al. | |
| 10,269,445 B1* | 4/2019 | Lee | G11C 5/14 |
| 2004/0008562 A1* | 1/2004 | Ito | G06F 11/1012 |
| | | | 365/223 |
| 2005/0099868 A1* | 5/2005 | Oh | G11C 11/406 |
| | | | 365/222 |
| 2005/0169083 A1* | 8/2005 | Riho | G06F 11/1004 |
| | | | 365/222 |

(Continued)

OTHER PUBLICATIONS

PCT Search Report for PCT App Ser No. PCT/US2018/029141, filed Apr. 24, 2018; Search Report dated Jun. 26, 2018; Search Report Received Jul. 11, 2018, Applicant: QUALCOMM Incorporated; Ten Pages.

*Primary Examiner* — Connie C Yoha
(74) *Attorney, Agent, or Firm* — Smith Tempel Blaha LLC

(57) ABSTRACT

Systems and methods are disclosed for error correction control (ECC) for a refreshable memory device coupled to a system on a chip SoC. The memory device including a parity region and a user data region. A method includes determining with the SoC a first refresh rate for the user data region of the memory device and a second refresh rate for the parity region of the memory device, where the second refresh rate is different than the first refresh rate. Parity data is generated for a write operation of a user payload data (UPD) to the user data region of the memory device. The user data region of the memory device is refreshed at the first refresh rate and the parity region is refreshed at the second refresh rate.

29 Claims, 6 Drawing Sheets

(56) References Cited

U.S. PATENT DOCUMENTS

| | | |
|---|---|---|
| 2007/0133331 A1* | 6/2007 | Park .................. G06F 11/106 |
| | | 365/222 |
| 2007/0277065 A1* | 11/2007 | Sato .................. G11C 29/42 |
| | | 714/703 |
| 2008/0092016 A1* | 4/2008 | Pawlowski ......... G06F 11/1044 |
| | | 714/764 |
| 2008/0189481 A1 | 8/2008 | Mayer et al. |
| 2011/0231601 A1 | 9/2011 | Pattabiraman et al. |
| 2016/0026533 A1* | 1/2016 | Ishikawa ............. G06F 11/1441 |
| | | 714/6.2 |
| 2019/0006001 A1* | 1/2019 | Chun ................ G11C 11/40607 |

* cited by examiner

SYSTEMS AND METHODS FOR IMPROVED ERROR CORRECTION IN A REFRESHABLE MEMORY

DESCRIPTION OF THE RELATED ART

Computing devices comprising at least one processor coupled to a memory are ubiquitous. Computing devices may include personal computing devices (e.g., desktop computers, laptop computers, cellular telephones, smart phones, tablet computers, portable digital assistants (PDAs), and portable game consoles), or may be included as components of larger products (e.g. appliances, automobiles, airplanes, military or construction equipment, etc.).

Such computing devices may use a volatile random access memory (RAM) such as a DDR (double-data rate) DRAM (dynamic random access memory). Such DRAM typically uses a refresh function or operation to keep memory contents during the operation of the computing device and/or when the computing device is in a power waving mode. Additionally, error correcting code (ECC) may be used with or for data stored in the DRAM to detect and/or correct data storage errors. The ECC may take the form of parity bits associated with the data stored in the DRAM used to detect and/or correct errors.

Storing the ECC parity bits on the DRAM takes up space in the memory arrays of the DRAM that could otherwise be used for data used by applications of programs executing or operating on the computing device. Additionally, the memory arrays for the ECC parity bits stored on the DRAM must also be refreshed, consuming power and draining the battery of the device. Accordingly, there is a need for improved systems and methods to implement ECC for data stored in the memory such as DRAM memories of computing devices.

SUMMARY OF THE DISCLOSURE

Systems, methods, and computer programs are disclosed for implementing improved error correction in a refreshable memory such as a DDR DRAM/LPDDR (Low Power DDR) DRAM in communication with a system on chip (SoC) of a computing device. In an exemplary system, the memory comprises a user data region for storing user data payloads and a parity region for storing the parity data used for error correction. The system includes logic of the SoC configured to determine a first refresh rate for the user data region of the memory device and a second refresh rate for the parity region of the memory device. The second refresh rate is different from the first refresh rate. The logic is also configured to generate parity data for a write operation of a user payload data (UPD) to the user data region of the memory device. The logic if further configured to refresh the user data region of the memory device at the first refresh rate and refresh the parity region of the memory device at the second refresh rate.

In an embodiment, a method for implementing ECC in a memory is provided, the method comprising defining a parity region and a user data region of a refreshable memory device, the memory device coupled to a system on a chip (SoC); determining with the SoC a first refresh rate for the user data region of the memory device; determining with the SoC a second refresh rate for the parity region of the memory device, the second refresh rate different than the first refresh rate; generating parity data for a write operation of a user payload data (UPD) to the user data region of the memory device; refreshing the user data region of the memory device at the first refresh rate; and refreshing the parity region of the memory device at the second refresh rate.

BRIEF DESCRIPTION OF THE DRAWINGS

In the Figures, like reference numerals refer to like parts throughout the various views unless otherwise indicated. For reference numerals with letter character designations such as "102A" or "102B", the letter character designations may differentiate two like parts or elements present in the same Figure. Letter character designations for reference numerals may be omitted when it is intended that a reference numeral to encompass all parts having the same reference numeral in all Figures.

DETAILED DESCRIPTION

Figure 1:
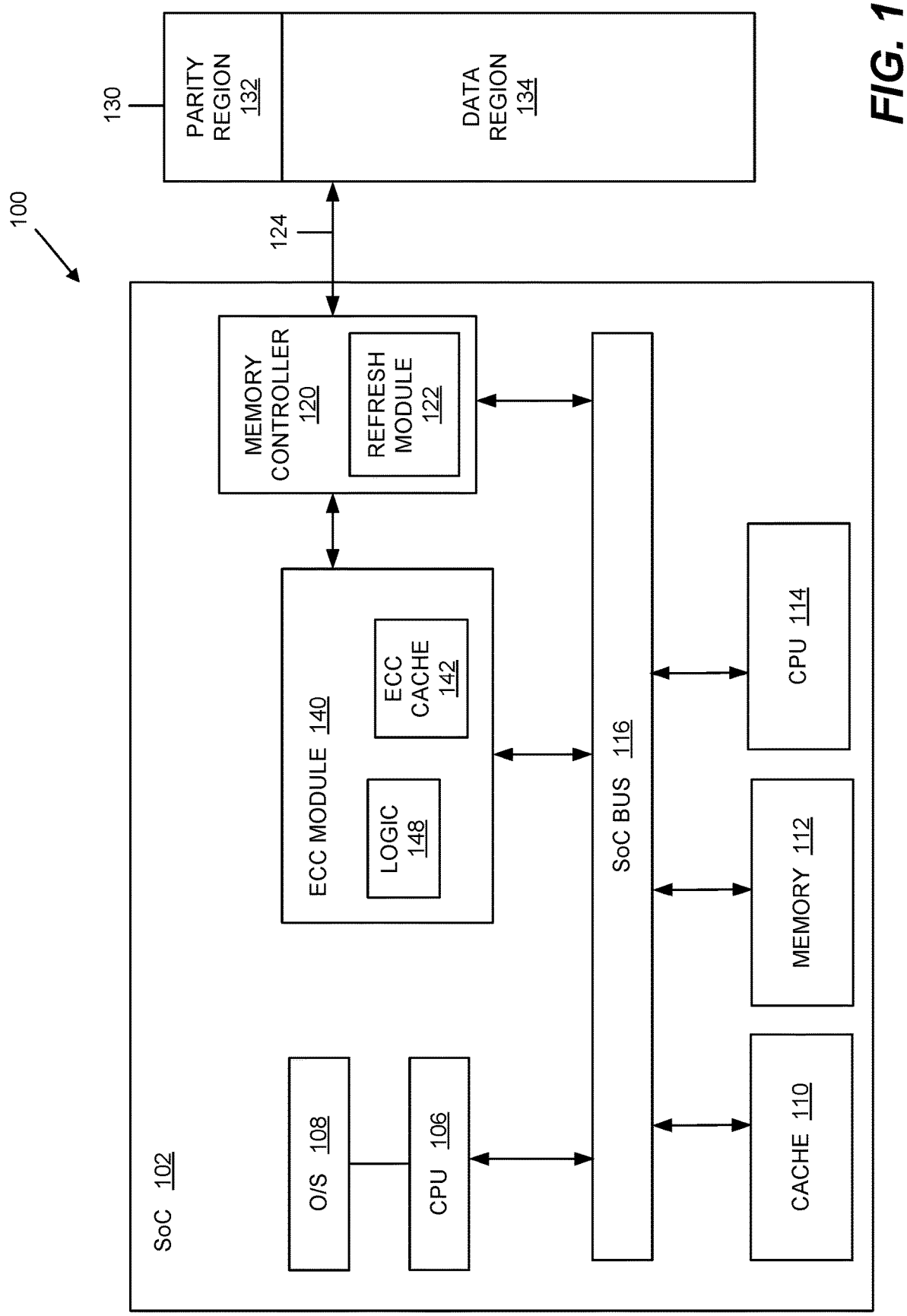
FIG. 1 is a block diagram of an embodiment of a system for implementing improved error correction in a refreshable memory in communication with a system on chip (SoC) of an exemplary computing device.

The word "exemplary" is used herein to mean "serving as an example, instance, or illustration." Any aspect described herein as "exemplary" is not necessarily to be construed as preferred or advantageous over other aspects.

In this description, the term "application" or "image" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component.

One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

In this description, the term "computing device" is used to mean any device implementing a processor (whether analog or digital) in communication with a memory, whether the computing device is a "stand alone" device such as a computer (including desktop computers, servers, laptop computers, handheld computers, tablets, etc.). "Computing device" also includes a processor in communication with a memory that is a part, portion, or component of a larger product, such as appliances, automobiles, airplanes, military or construction equipment, etc. A "computing device" may also be a "portable computing device" (PCD) and the terms PCD, "communication device," "wireless device," "wireless telephone", "wireless communication device," and "wireless handset" are used interchangeably herein. With the advent of third generation ("3G") wireless technology and four generation ("4G"), greater bandwidth availability has enabled more portable computing devices with a greater variety of wireless capabilities. Therefore, a portable computing device may also include a cellular telephone, a pager, a PDA, a smartphone, a navigation device, or a hand-held computer with a wireless connection or link.

Memory accesses in computing devices (CDs), and especially memory accesses by a system on a chip (SoC) and a memory located external to the SoC ("off chip") are typically performed by a high performance access channel. Data is transferred between a processor (or another component of the CD) and a memory device over the access channel. A variety of standards, protocols, or technologies may be used to perform the transfer of the data and this disclosure is not limited to any particular data transfer standard. Additionally, the memory devices discussed herein may be any memory device, such as for example a dynamic random access memory (DAM) like a double data rate synchronous dynamic (DDR) RAM according to one of the DDRx or LPDDRx (Low Power DDR) standards.

Memory devices in communication with an SoC may also be protected by error correcting/correction code (ECC). ECC comprises extra bits typically sent or stored with the data being stored on the memory that assist in detecting transmission or other errors when the data stored on the memory is read or retrieved from the memory, referred to herein as parity bits. The stronger the error correction, the more parity bits are typically required. In typical computing devices the memory device is sized to store the parity bits in addition to the data being held by the memory device. However, transmission of the ECC bits requires either a larger communications bus to accommodate the additional bits to be stored with the underlying data, or additional transactions over a standard communication bus to transmit the parity bits in addition to the transmission of the underlying data to the memory.

In any type of DDR DRAM memory devices, information content is stored in the form of electrons in tiny capacitors inside the DDR DRAM memory devices. The presence of the electrons is interpreted as a data value of "1" and the absence of the electrons as a data value of "0". These electrons can leak over time, leading to data corruption. Hence, DDR DRAM memory devices need to refresh to replenish the electrons to avoid data corruption.

The system and methods of the present disclosure implement an ECC cache on, or in communication with, the SoC to avoid the need to continually write ECC parity bits to the DRAM memory. Additionally, or alternatively, when the ECC parity bits are stored on the DRAM, the system and methods of the present disclosure provide a parity region in the DRAM for storing the parity bits and a data region of the DRAM for storing the underlying user data payloads for which the parity bits provide error correction. The data region of the DRAM is refreshed at a first refresh rate, while the parity region of the DRAM is refreshed at a second refresh rate that is higher than the first refresh rate.

By over-refreshing the parity region at the higher refresh rate, the present system and methods ensure that fewer or zero "soft" errors occur for the parity bits stored in the parity region. This in turn allows the error correction to focus on the user data payloads of the data region, providing stronger error correction for the data stored in the data region, without the need to also over refresh that data region of the DRAM. Because parity region of the DRAM is significantly smaller than the data region, the present systems and methods allow for greater/stronger error correction for the user data payloads without significantly increasing the power consumption.

FIG. 1 illustrates an embodiment of a system 100 for implementing error correction in a random access memory device 130 in communication with a system on chip (SoC) 102. The system 100 may be implemented in any computing device, including a personal computer, a workstation, a server, a portable computing device (PCD), such as a cellular telephone, a portable digital assistant (PDA), a portable game console, a tablet computer, or a wearable computer. The system 100 may also be implemented in a computing device that is a portion/component of another product such as an appliance, automobile, airplane, construction equipment, military equipment, etc.

As illustrated in the embodiment of FIG. 1, the system 100 comprises an SoC 102 electrically coupled to an external or "off chip" random access memory device 130. The random access memory device 130 may be any type of refreshable memory device and in the illustrated embodiment is implemented as a dynamic random access memory device (DRAM) 130. The SoC 102 comprises various on-chip components, including a processing unit such as CPU 106, a memory controller 120, a system cache 110, a system memory 112, all interconnected via a SoC bus 116. In some embodiments, such as the one illustrated in FIG. 1, the SoC 102 may also include one or more additional processors like CPU 114 also connected to the SoC bus 116.

The CPU 106 may be controlled by or execute an operating system (OS) 108 that causes the CPU 106 to operate or execute various applications, programs, or code stored in one or more memory of the computing device. In some embodiments the CPU 106 and CPU 114 may be the same type of processor, while in other embodiments the CPU 114 may be a digital signal processor (DSP), a graphics processing unit (GPU), an analog processor, or other type of processor different from CPU 106 executing the OS 108.

The system cache 110 memory of FIG. 1 may be an L2, L3, or other desired cache. Additionally the system cache 110 may be dedicated to one processor, such as CPU 106, or may be shared among multiple processors in various embodiments, such as the CPU 106 and CPU 114 illustrated in FIG. 1. In an embodiment, the cache 110 may be a last level cache (LLC) or the highest (last) level of cache that the CPU 106 calls before accessing a memory like DRAM 130.

System memory 112 may be a static random access memory (SRAM), a read only memory (ROM) 112, or any other desired memory type, including a removable memory such as an SD card. The SoC 102 may include one or more memory clients that request memory resources from DRAM 130 located external to the SoC 102 or "off chip." The memory clients may comprise one or more processing units (e.g., CPU 106, a GPU, a DSP, etc.), a video encoder, or other clients and/or components of the SoC 102 requesting read/write access to DRAM 130.

DRAM 130 is partitioned into at last one data region 134 and at least one parity region 132. Data region 134 stores user payload data, such as that used or generated by applications of programs executed by CPU 106. Parity region 132 stores ECC parity bits associated with the user payload data stored in data region 134 as discussed below. Although a single data region 134 and single parity region 132 is illustrated in FIG. 1, other configurations are possible. One such additional configuration (not illustrated) is a "split" configuration with multiple data regions 134 and parity regions 132, where each parity region 132 stores parity data for a different data region 134 of DRAM 130. In some implementations, the parity region 132 may not be a portion of DRAM 130, but may instead comprise a separate memory (or portion of a separate memory), either on the SoC 102 such as memory 112, or an additional "off chip" memory in communication with the SoC 102 (not illustrated).

The SoC 102 further includes a memory controller 120 electrically connected to the SoC bus 116 and also connected to DRAM 130 by a memory access channel 124 which may be a serial channel or a parallel channel in various embodiments. Memory controller 120 manages the data read from and/or stored to the various memories accessed by the SoC 102 during operation of the system 100, including DRAM 130 illustrated in FIG. 1. Memory controller 120 includes a refresh module 122 which may be powered on a different power island than one or more other modules or components of the SoC 102. Thus, refresh module 122 may remain powered on (e.g., may receive power from a power supply of the different power island) while the SOC 102 is powered down in a low power, sleep, or power saving mode.

The refresh module 122 is configured to refresh the DRAM 130 during operation of system 100, including during any power saving mode, and as discussed below is configured to refresh the data region 134 at a first refresh rate and the parity 132 region at a second refresh rate which is different from (and typically higher than) first refresh rate for the data region 134. The second refresh rate for the parity region 132 may be determined by the SoC 102 and based on calibration data determined based on calibration tests described in more detail below. The SoC 102 may be configured to determine, access, and/or store the calibration data. The calibration tests may be performed while the SoC 102 is coupled to the DRAM 130 (e.g., after the SoC 102 and the DRAM 130 are assembled in a consumer device)

Memory controller 120 may also include other portions or components not illustrated in FIG. 1 such as a read and/or write buffer, control logic, etc., to allow memory control 120 to control the data transfer over the memory access channel 124. In various implementations, some or all of the components of the memory controller 120 may be implemented in hardware, software, or firmware as desired.

DRAM 130 interfaces with the SoC 102 through memory controller 120 via a high-performance memory bus comprising an access channel 124, which may be any desired width. In an embodiment, the parity region 132 of DRAM 130 may be sized to allow all of the ECC data or parity bits associated with data written to the data region 134 of DRAM 130 to be stored in the parity region 132. In an implementation, the parity region 132 may comprise 3-6% of the storage space of DRAM 130, and the size of the parity region 132 may depend on the strength of the error correction provided, such as single error correction/double error detection (SEC/DED), double error correction/triple error detection (SEC/TED), etc.

SoC 102 of system 100 also includes an ECC module 140 electrically coupled to the memory controller 120 as well as to the SoC Bus 116. In the embodiment of FIG. 1, the ECC module 140 includes an ECC cache 142 and logic 148. In other embodiments, the ECC module 140 may contain more or fewer components. In some implementations the ECC module 140 may not be a separate module on the SoC 102, but instead one or more of the portions or functions of the illustrated ECC module 140 may be contained in, or performed by, other portions of the SoC 102, such as for example memory controller 120, system cache 110, and/or system memory 112. Additionally, in various implementations, some or all of the components or functions of the ECC module 140 may be implemented in hardware, software, or firmware as desired.

Figure 2:
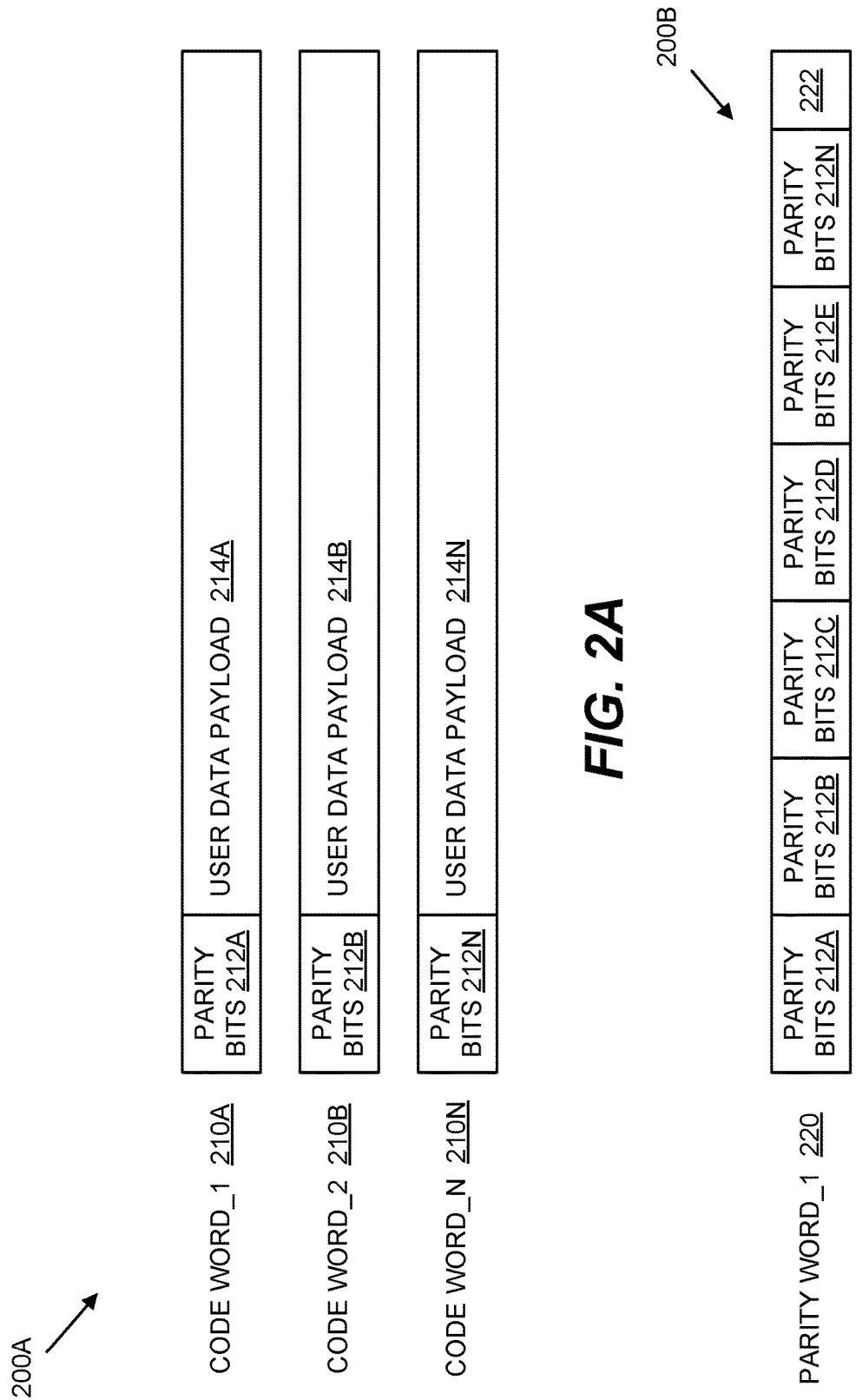
FIG. 2A is a block diagram illustrating exemplary code words that may be generated by the system of FIG. 1 during a write operation to the memory in communication with the SoC.
FIG. 2B is a block diagram illustrating an exemplary parity word that may be created from the code words of FIG. 2A.

The ECC module 140 is configured to compute parity data (e.g., parity bit sequences and/or one or more parity words for write operations to DRAM 130, to temporarily store the parity data in ECC cache 142, and to check the parity data for read operations from DRAM 130. For example, as illustrated in FIG. 2A, during operation of the system 100 an application or program executing on CPU 106 may generate a command to write data to DRAM 130. Such data is represented in FIG. 2A as user data payload 214A-214N each of which may comprise 32 bytes (or any other desired length accommodated by DRAM 130 and/or memory access channel 124.

ECC module 140 generates or computes error correction parity bits 212A-212N for each of the user data payloads 214A-214N to be written to DRAM 130, forming code words 210A-210N. This function may be performed by logic 148 of ECC module 140. The number of parity bits generated may depend on the strength of error correction provided (e.g., SEC-DED, DEC-TED, etc.). For example, when the ECC scheme employed by the ECC module 140 is a SEC-DED scheme, a nine-bit parity sequence may be required for each 256 bits of user data. To illustrate, the ECC module 140 may generate a 9 bit parity sequence (parity bits 212A-212N) for each user data payload 214A-214N using a modified Hamming code to generate code words 210A-210N of length l=265 with data bits K=256, and parity bits=9. In other implementations, such as when the ECC scheme employed by the ECC module 140 is a DEC-TED correction scheme, parity bit sequences longer than 9 bits (e.g., 14 bit parity bit sequences) may be used.

Additionally, ECC module 140 may take the parity bits 212A-212N from code words 210A-210N and generate one or more parity words 220 (e.g., a word-length set of parity data) as illustrated in FIG. 2B. In an embodiment, a parity word 220 may have a length corresponding to a particular word-length of DRAM 130. For example, when DRAM 130 operates using a word-length of 32 bytes, the ECC module 140 may assemble parity data or parity bits 212A-212N for multiple write operations (e.g. parity data generated for multiple user data payloads 214A-214N) to generate one or more parity words 220 having a length of 32 bytes. For such examples, each parity word 120 may include a concatenation of the parity data sequences, where each of the concatenated parity data sequences corresponds to a parity bit 212A-212N sequence from a different code word 210A-210N.

Each parity word 220 may also include one or more filler bits 222 to ensure that every parity word 220 is a fixed size, e.g. 32 bytes. Filler bits 222 may or may not include metadata related to the error correction (e.g. ECC version, cached status, etc). Filler bits 222 may or may not include a secondary level of error correction/detection computed on just the parity word 220. For example, a parity word 220 consisting of parity bits 212A-212N may have a simple checksum calculated on those bits and then stored in filler bits 222, thereby further improving the reliability of parity words 220. Continuing with the above example where each of parity bits 212A-212N is 9 bits and DRAM 130 uses a word-length of 32 bytes, the value of "N" in FIG. 2B may be 28 and each parity word 220 may comprise 28 sets of 9 parity bits 212A-212N (252 bits total) with 4 filler bits 222 to form a 256 bit/32 byte parity word 220.

Each parity word 220 may initially be stored in ECC cache 142 rather than DRAM 130 to reduce the number of data transmissions from SoC 102 to DRAM 130. Note that ECC cache 142 is preferably configured so that only parity data, such as parity words 220, are stored in the ECC cache 142, not the underlying user data such as user data payloads 212A-212N. As a result, ECC cache 142 may be relatively small (e.g. compared to system cache 110) when implemented as a separate or dedicated cache memory. In other implementations, ECC cache 142 may be a portion or partition of another memory on the SoC 102 such as system cache 110.

In another embodiment (not illustrated in FIG. 1), multiple ECC modules 140 may be implemented on the SoC 102, operating in parallel. For such embodiments, the different ECC modules 140 may be configured to handle different sized write/read requests. For example, in an implementation, a first ECC module 140 may be configured with a first ECC cache 142 of a first size and operate as discussed above in conjunction with DRAM 130. A second ECC module 140' (not illustrated) may be configured with a second ECC cache 142' of a second size and operate as discussed above in conjunction with DRAM 130 and/or with a second DRAM 130' (not illustrated). For such multiple ECC module 140 embodiments, it is not necessary that each of the different ECC modules 140/140' have the same number or, or same configurations of, components discussed above.

As noted, it is preferred to initially store the ECC data in the ECC cache 142 to minimize the transactions between SoC 102 and DRAM 130. However, during operation the parity data will be written to DRAM 130 from time to time. For example, during operation the SoC 102 may be configured to operate in a first active mode or a second active mode. In the first active mode, the SoC 102 may be configured to selectively write parity data (e.g., the one or more parity words 220) to the DRAM 130. For example, the SoC 102 may be configured to write parity data from the ECC cache 142 to DRAM 130 when the SoC 102 is about to change from the first active mode to a power saving mode. Additionally or alternatively, the SoC 102 may be configured to write parity data from the ECC cache 142 to DRAM 130 when the ECC cache 142 is full and/or new parity data replaces parity data in the ECC cache 142 that is no longer being used. Additionally or alternatively, processor 106 may periodically or occasionally write cached parity data back to DRAM 130 to synchronize parity data.

Thus, SoC 102 may be configured to write parity data from the ECC cache 142 to DRAM 130 during the first active mode only when certain conditions are met, which may reduce a number of ECC parity data write operations performed across the memory access channel 124 to DRAM 130. To illustrate, when the SoC 102 is operating in the first active mode during a first write operation, the ECC module 140 may be configured to compute parity data (e.g., "first parity data" or a "first parity bit sequence") associated with first data (e.g., "first user data") to be written during the first write operation. The ECC module 140 may store the first parity data in the ECC cache 142 (e.g., as a portion of a parity word 220). The SoC 102 may be configured to provide the first user data via the memory access channel 124 to the data region 134 of DRAM 130 during the first write operation without writing the first parity data to the parity region of DRAM 130.

Subsequently, during a second write operation, the ECC module 140 may be configured to compute parity data (e.g., "second parity data" or a "second parity bit sequence") for second data (e.g., "second user data") to be written during the second write operation. The ECC module 140 may store the second parity data in the ECC cache 142 (e.g., as a portion of the same parity word 220 that includes the first parity data). The SoC 102 may be configured to provide the second user data via the memory access channel bus 124 to the data region 134 of DRAM 130 during the second write operation without writing the second parity data to the parity region 132 of DRAM 130.

At some later point when the SoC 102 determines (e.g., via the OS 108) that the SoC 102 is about to change from the active mode to a power saving mode, the first parity data and the second parity data stored in the ECC cache 142 may be written out to the parity region 132 of DRAM 130 (via the memory access channel 124) by writing the parity word 220 (e.g., a single parity word 220A) that includes the first parity data and the second parity data. Thus, in the first active mode, parity data corresponding to multiple UDPs may be selectively written to the DRAM 130 using a single write operation, thereby reducing the number of transactions over the memory access channel.

In the second active mode, caching of parity data at the ECC cache 142 may be disabled. Thus, in response to each write operation from the SoC 102 to the DRAM 130, both data (e.g., user data) and parity data may be written to the respective data region 134 and parity region 132 of DRAM 130. Accordingly, when the SoC 102 is in the first mode, the SoC 102 may be configured to write parity data from the ECC cache 142 to the DRAM 130 only under certain conditions (such as when the ECC cache module 142 is full, to synchronize parity data, or when the SoC 102 is transitioning to a power saving mode), and when the SoC 102 is in the second mode, the SoC 102 may be configured to write parity data to the DRAM 130 during every write operation.

Figure 3:
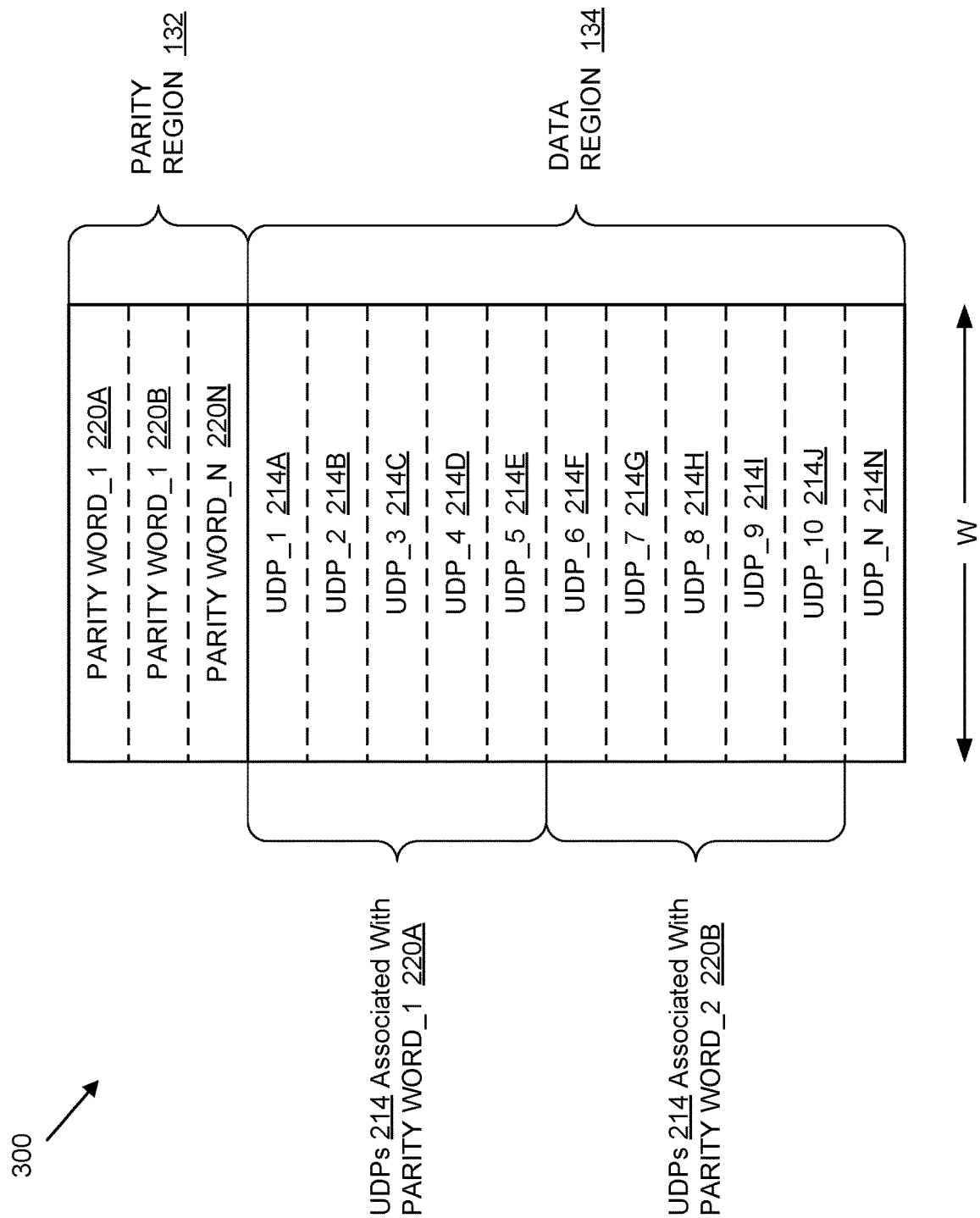
FIG. 3 is a block diagram illustrating a mapping scheme to map data into a memory.

As a result, DRAM 130 includes a parity region 132 sufficiently sized and configured to store parity words 220 for the user data written to the data region 134 of DRAM 130. FIG. 3 depicts an exemplary memory map 300 illustrating storage of parity data and user data in a DRAM such as DRAM 130 of FIG. 1. FIG. 3 illustrates a single split embodiment and the parity data may correspond to the one or more parity words 220 of FIG. 2B. For example, FIG. 3 depicts storage of the one or more parity words 220 of FIG. 2B (e.g., the one or more parity words 220 generated by the ECC module 140 and cached in the ECC cache 142 as discussed below) and user data written from the SoC 102 to the DRAM 130.

In the single split embodiment of FIG. 3, user data (e.g., user data payloads UDP_1 214A through UDP_N 214N) associated with multiple parity words 220A-220N may be grouped together in (e.g., stored at) sequential memory addresses of the DRAM 130 of FIG. 1 (e.g., grouped together in a user data region 134). For example, a first parity word_1 220A may include parity data corresponding to UDP_1 214A through UDP_5 214E, and a second parity word 220B may include parity data generated/associated with UDP_6 214F through UDP_10 21J. The UDPs 214A-214E associated with the first parity word 220A and the UDPs 214F-214J associated with the second parity word 220B may be mapped to or stored at sequential memory addresses in the user data region 134.

In the single split embodiment, parity words 220A-220N may be grouped together in sequential memory addresses in a parity region 132. For example, the first parity word 220A and the second parity word 220B may be stored at sequential memory addresses in the parity region 132 of the DRAM 130 (of FIG. 1). Although the parity region 134 is illustrated as including three parity words 220A-220N, in other examples, the DRAM 130 of FIG. 1 may be configured to include a parity region 132 that is configured to store more or fewer parity words. Similarly, although the user region 134 is illustrated as including eleven UDPs 214A-214N, in other examples, the DRAM 130 may include a user data region 134 configured to store more or fewer UDPs, and each of the parity words 220A-220N may correspond to more than or fewer than 5 UDPs.

In some examples, the user data region 134 may be configured to store N user data payloads, and the parity region 132 may be configured to store N/Y parity words, where Y represents a number of parity bit sequences per parity word (e.g., a number of UDPs associated with each parity word). Thus, the parity region 132 may comprise 100/Y percent of the memory of the DRAM 130 of FIG. 1. To illustrate, in a particular example, each parity word 220 generated by the ECC module 140 may have a length W (e.g., 32 bytes) and may include Y (e.g., twenty-eight) parity bit sequences of length Z (e.g., nine-bit parity sequences), where each of the Y parity bit sequences corresponds to a different UDP. In this example, the parity words region 220 may correspond to about 3.6% (e.g., 100/28) of the memory of the DRAM 130 of FIG. 1.

As will be understood, other sizes and configurations of the parity region 132 and data region 134 are possible. For example, if a stronger error correction scheme is implemented the sizes of the parity region 132 and data region 134 may be different than described above. To illustrate, if sixteen-bit parity sequences are used instead of nine-bit parity sequences, approximately 5.88% of the DRAM 130 will be required for the parity region 132 (rather than the 3.6% used for parity region 132 for the nine-bit parity sequences). Correspondingly, approximately 94.12% of the DRAM 130 will be required for the data region 134 if sixteen-bit parity sequences are used (rather than the 96.4% used for the data region 134 for nine-bit parity sequences).

By way of another example, the regions 132, 134 may be arranged in a distributed scheme in another embodiment (not illustrated). For such a distributed embodiment, the first parity word 220A may be paired with (e.g. stored adjacent to) the parity word's 220A respective user data (i.e. UDP_1 214A through UPP_5 214E of FIG. 3) to form a parity/payload pair that is stored at sequential memory addresses of DRAM 130. Similarly, for such embodiments, the second parity word 220B may be paired with (e.g. stored adjacent to) the parity word's 220B respective user data (i.e. UDP_6 214F through UPP_10 214J of FIG. 3) to form a parity/payload pair that is stored at sequential memory addresses of DRAM 130. Other configurations of the parity region 132 and data region 134 are also possible.

Returning to FIG. 1, as part of an initialization of the system 100 and/or prior to the operation of system 100 as part of a computing device, calibration tests for DRAM 130 may be performed by or using the SoC 102. For example, the calibration tests may be performed using the system memory 112, the one or more processors 106 and 114, and the memory controller 120. As an example, the system memory 112 may store programs that, when executed by the SoC 102 (e.g., using CPU 106), cause the SoC 102 to perform calibration operations of the calibration tests as further described below. Results of the calibration tests may correspond to a number of memory errors (e.g., an error rate) detected at different DRAM refresh rates under varying conditions of DRAM 130.

To illustrate, during an exemplary first calibration test, the SoC 102 may be configured to execute programs (e.g., stored in the system memory 112) to perform a "data fill" step including writing at least a portion of the parity region 132 and data region 134 of the DRAM 130 with a pattern of parity data and data, respectively. The SoC 102 may also be configured to execute programs (e.g., stored in the system memory 112) to perform a "refresh rate configuration" step that causes the refresh module 122 of memory controller 120 to refresh contents of the DRAM 130 at a first refresh rate for a particular amount of time. The SoC 102 may be configured to perform a "data read" step including reading the data and the parity data from the data region 134 and parity region 132 of DRAM 130 after the contents of the DRAM 130 have been refreshed at the first refresh rate for the particular amount of time. The SoC 102 (e.g., using the ECC module 140) may be configured to perform a "check" step by analyzing/checking the data and the parity data read from the DRAM 130 to detect errors (e.g., error results detected during the "first calibration test"). The SoC 102 may be configured to perform a "data log" step including logging the error results detected during the first calibration test. For example, the SoC 102 may be configured to log the error results in the system memory 112, to non-volatile memory (not shown), or to another device connected via an interface such as USB 642 in FIG. 6.

A second or additional calibration tests may be performed at one or more other refresh rates. Each calibration test may be performed multiple times (e.g., a particular number of times) at one or more of the refresh rates (e.g., multiple times at the first refresh rate and multiple times at the one or more other refresh rates). In some aspects, a calibration test may be performed multiple times at the refresh rates to gather error margin data. For example, a calibration test may be performed the particular number of times at the first refresh rate to collect a large enough sample size of error results at the first refresh rate to establish a reliable mean and standard deviation of error results for the calibration test performed at the first refresh rate.

Alternatively or additionally, the calibration tests may be performed at successively slower refresh rates until a particular number of errors is identified. For example, calibration tests may be performed at successively slower refresh rates until a single error is detected. Alternatively or additionally, the calibration tests may be performed at successively slower refresh rates until a greater number of errors than the ECC module 140 can correct are detected. In response to detecting the particular number of errors at the first refresh rate, the refresh rate of DRAM 130 may be adjusted to perform calibration tests at an untested refresh rate. The above process may be performed iteratively until all desired refresh rates have been tested and a sufficient sample size of error results is collected to provide statistics for all desired refresh rates.

Alternatively or additionally, the above-described calibration tests may only be performed on one of the parity region 132 or data region 134 of DRAM 130 rather than on both regions. Regardless of how performed, the results of the calibration tests may correspond to or may be used to generate the calibration data. The calibration data may be stored in or indexed in a look up table (LUT). The LUT may indicate a number of errors detected during calibration tests performed at a set of refresh rates, and may also include error margin data associated with each refresh rate of the set of refresh rates. The LUT may be determined based on calibration tests performed at a desired set of refresh rates. For example, the calibration tests may be performed using refresh rates R1, R2, and R3 while the DRAM 130 operates under certain conditions and refresh rates R4, R5, and R6 while the DRAM 130 operates under other conditions. To illustrate, the calibration tests performed at the set of refresh rates may indicate that no errors are detected during performance of one or more calibration tests at the refresh rate R4, that one error is detected during performance of one or more calibration tests at the refresh rate R5, and two errors are detected during performance of one or more calibration tests at the refresh rate R6. In other examples, more than or fewer than six refresh rates may be tested and stored in the LUT. The refresh rate data and/or LUT may be stored at a memory in the SoC 102, in a non-volatile memory such as a flash memory coupled to the SoC 102, or in the DRAM 130.

During operation, the SoC 110 may be configured to refresh the data region 134 of DRAM 130 at a first refresh rate. The first refresh rate may be preset, or may be determined based on the calibration data from the one or more calibration tests performed while the SoC 102 is coupled to the DRAM 130 (e.g., as described above). The first refresh rate may be a refresh rate that is expected, or has been determined, to result in an acceptable or desired number of memory errors in the data region 134 of DRAM 130. In an embodiment, the acceptable or desired number of memory errors may be maximum or threshold number of errors, which may correspond to a number of memory errors that can be detected or corrected by the error correction scheme/method implemented by ECC module 140 for DRAM 130.

During operation, the SoC 102 may be configured to refresh the parity region 132 of DRAM 130 at a second refresh rate that is different from the first refresh rate for the data region 134 of DRAM 130. The second refresh rate may be determined based on the calibration data from the one or more calibration tests performed while the SoC 102 is coupled to the DRAM 130 (e.g., as described above). The second refresh rate may be a refresh rate that is expected, or has been determined, to result in an acceptable or desired number of memory errors in the parity region 134 of DRAM 130. In an embodiment, the acceptable or desired number of memory errors may be zero errors, or an insignificant number of memory errors, in order to ensure that no error correction by the ECC module 140 is required for the parity region 134 of DRAM 130.

One or more of the first refresh rate and second refresh rate may be determined and/or implemented by refresh module 122 of memory controller 120 using the calibration data discussed above, such as by reading such data from a LUT. For example in an embodiment, the calibration data may indicate a specific number of errors expected for each refresh rate. In these embodiments, during operation, refresh module 122 may determine the slowest first refresh rate that will result in the acceptable or desired number of memory errors in the data region 134 and/or the slowest second refresh rate that will result in the desired (or zero) number of memory errors in the parity region 132.

Alternatively or additionally, refresh module 122 may determine one or more of the first refresh rate and second refresh rate using error margin data collected during the calibration tests. For example, refresh module 122 may be configured to determine a slowest first refresh rate that is not expected to result in a memory error rate greater than a threshold value or desired value for the data region 134 and/or the slowest second refresh rate that is not expected to result in a memory error rate greater than a second threshold or desired value (such as zero) for the parity region 132.

As will be understood, the refresh rate(s) chosen and/or the calibration data from which the refresh rate(s) are determined may vary depending on the error correction scheme employed by the ECC module 140 and/or the frequency at which the ECC module 140 performs error correction (i.e. any desired interval in the case of infrequent reads from data region 134 of DRAM 130). For example, it is expected that the calibration data for a SEC-DED error correction scheme may differ from the calibration data for a DED-TED error correction scheme. As a result, the first and/or second refresh rate determined from the calibration data for a DRAM 130 protected by a SEC-DED error correction scheme may vary from the first and/or second refresh rate determined from calibration data for a DRAM 130 protected by a DED-TED error correction scheme.

Figure 4:
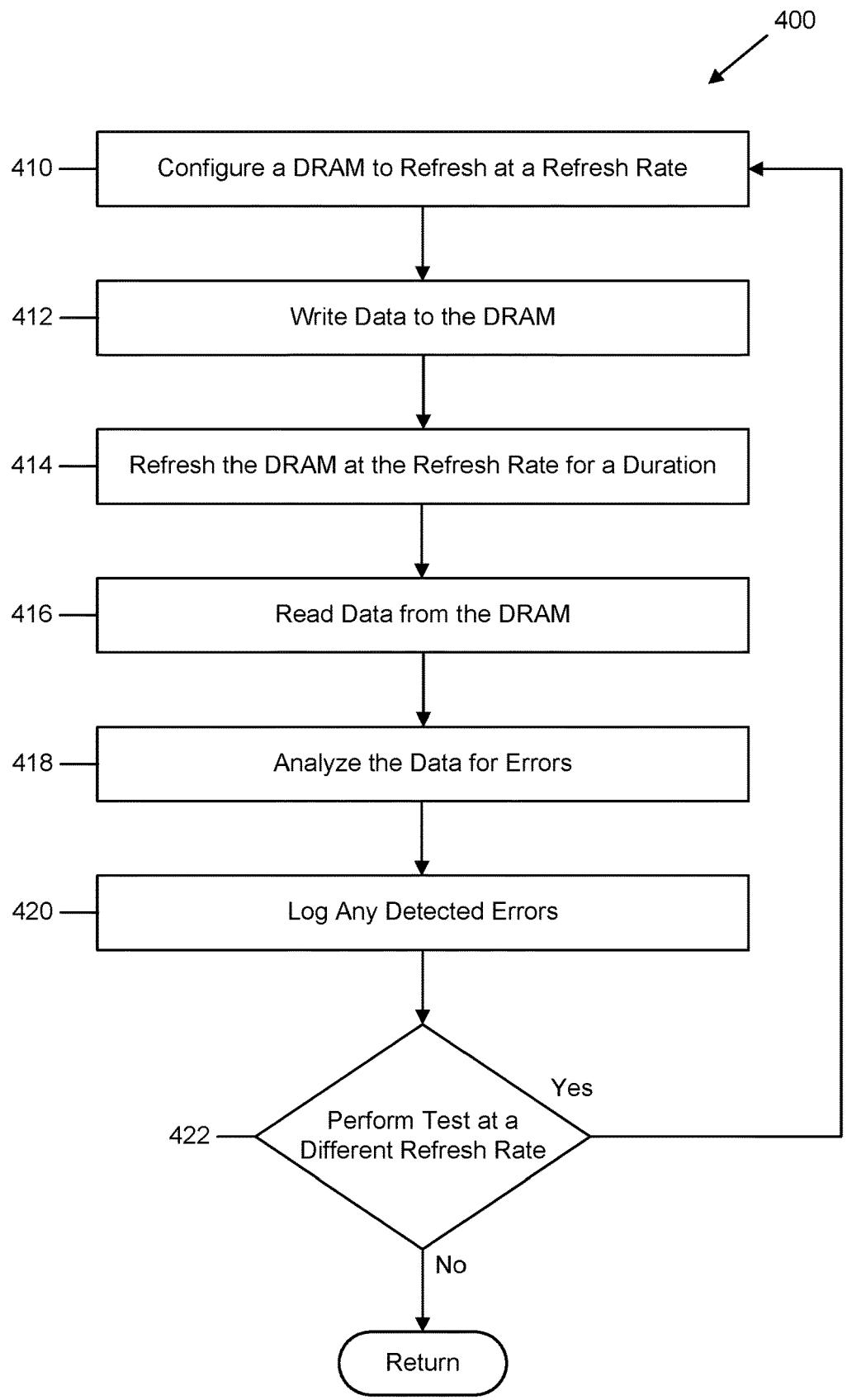
FIG. 4 is a flowchart illustrating an embodiment of a method for performing refresh rate calibration tests on a memory while the memory is coupled to an SoC.

Turning to FIG. 4, a flowchart an exemplary method 400 for performing refresh rate calibration tests is illustrated. In an embodiment, the method 400 may be implemented by a system such as system 100 of FIG. 1. Method 400 includes, at 410, configuring an SoC such as SoC 102 coupled to the DRAM 130 of FIG. 1 to refresh the DRAM 130 or one or more of data region 134 and parity region 132 of DRAM 130 at a particular refresh rate for the first calibration test. For example, as described above, the SoC 102 may be configured to execute programs (e.g., stored by the system memory 112) that configure the refresh module 122 of memory controller 120 to refresh the DRAM 130 at a particular refresh rate for the first calibration test.

Method 400 includes, at 412, writing data to DRAM 130. For example, the SoC 102 may be configured to write a pre-determined pattern of data (e.g., data corresponding to user data and parity data) from the system memory 112 to the data region 134 and parity region 132, respectively, of DRAM 130 as described above. The method 400 includes, at 414, refreshing the DRAM 130 for a particular duration (e.g., a particular amount of time or a time based on a particular number of refresh operations) at the particular refresh rate.

The method 400 includes, at 416, reading the data from the DRAM 130 after refreshing the DRAM 130 for the particular duration. The method 400 includes, at 418, analyzing the data for the first calibration test (e.g., the data read from the DRAM 130 at 416). Such analysis may be performed by ECC module 140, such as by logic 148 of ECC module 140. In an embodiment, the analysis for errors at 418 may include analyzing the data for errors under multiple error correction schemes (e.g., SEC-DED, DEC-TED, etc.) to determine the number of errors in the first calibration test for each error correction scheme. Method 400 includes logging errors detected in the data for the first calibration test at 420, such as in a LUT as described above. Thus, method 400 includes performing a first calibration test at a particular refresh rate.

Method 400 further includes at 422 determining whether to perform one or more subsequent calibration tests at different refresh rates. As described above, multiple calibration tests may be performed at different refresh rates, and 422 may include determining whether one or more calibration tests remain to be performed at a different refresh rate than the particular refresh rate. For example, when the calibration tests are performed at a pre-determined set of refresh rates, the 422 may include determining whether a calibration test has been performed for all of the refresh rates of the pre-determined set of refresh rates. When the calibration test has not been performed for one or more refresh rates of the pre-determined set of refresh rates, the method 400 determines at 422 that one or more calibration tests at a different refresh rate of the pre-determined set of refresh rates remain to be performed.

Alternatively or additionally, as described above, in some examples, the calibration test may be performed at successively slower refresh rates until a particular number of errors are detected at the particular temperature. In these examples, when the particular number of errors is not detected at the particular refresh rate, the method 400 at 422 may determine that one or more calibration tests remain to be performed at a different refresh rate.

When the determination at 422 is that one or more calibration tests remain to be performed at a different refresh rate, the SoC 102 may be configured to cause DRAM 130 (or data region 134 and/or parity region 132) to be refreshed at the different refresh rate, and the steps 410-420 may be performed again at the different refresh rate. When it is determined at 422 that no further calibration tests remain to be performed (e.g., when all refresh rates of the pre-determined set of refresh rates have been tested or the particular number of errors has been detected), the calibration tests are completed and method 400 ends. In this manner, method 400 allows calibration tests for DRAM 130 and/or the various regions 132, 134 of DRAM 130 at different refresh rates prior to operation of the DRAM 130 as part of system 100 (see FIG. 1).

As described above, the calibration test of method 400 may be performed multiple times (e.g., a particular number of times) at each of the refresh rates. For example, the first calibration test may be performed the particular number of times to collect a large enough sample size of error results at the first refresh rate to establish a reliable mean and standard deviation of error results for the calibration tests performed at the first refresh rate. The error margin data may supplement the stored logged error data described in step 420.

Figure 5:
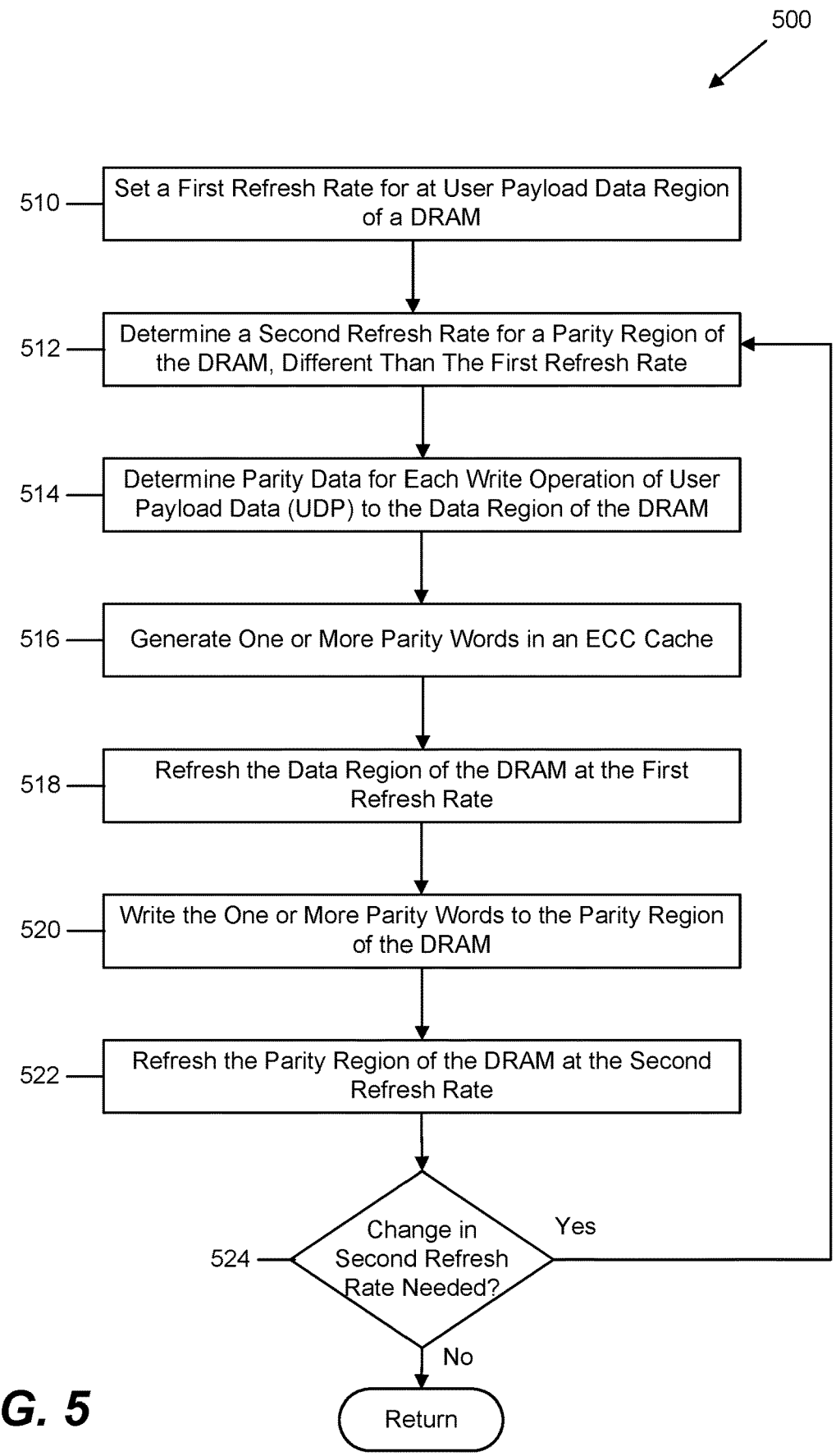
FIG. 5 is a flowchart illustrating an embodiment of a method for improved error correction in a refreshable memory.

Calibration data determined using the results of the calibration tests may be used to select a refresh rate at which to refresh one or more of data region 134 and parity region 132 of DRAM 130 during operation of the system 100 (FIG. 1) in order to provide improved error correction. FIG. 5 is a flowchart illustrating an embodiment of a method 500 for improved error correction in a refreshable memory, such as DRAM 130. The method 500 may be performed by the system 100 of FIG. 1 or portion s of the system 100, such as DRAM 130 and SoC 102 (or portions of the SoC such as ECC module 140 and/or refresh module 122 of memory controller 120). The method 500 includes, at 510, setting a first refresh rate at which to refresh a user data payload region of a refreshable memory, such as data region 134 of DRAM 130. The first refresh rate may be a pre-determined or pre-set value.

Alternatively, the first refresh rate in some embodiments may be set by determining the first refresh rate based at least in part on calibration data as described above with reference to FIG. 1. For such embodiments, the calibration data for the data region 134 is used to determine the first refresh rate may be gathered using calibration tests performed on DRAM 130 while the SoC 102 is coupled to the DRAM 130 using method 400 as described above with reference to FIG. 4. The calibration data may correspond to the calibration data discussed above, and the SoC 102 (or the refresh module 122 of SoC 102) may determine the first refresh rate as described above with reference to FIG. 1. For example, the calibration data may be indexed in a LUT and determining the first refresh rate may include accessing, by the SoC 102 (or refresh module 122), the LUT to select a first refresh rate associated with the desired or acceptable error rate for the data region 134 for the error correction scheme implemented by ECC module 140.

Regardless of how the first refresh rate is set in block 510, a second refresh rate for a parity data portion of the refreshable memory, such as parity region 132 of DRAM 130, is determined in block 512. The second refresh rate is different than the first refresh rate, and typically will be a faster refresh rate, resulting in the parity region 132 of DRAM 130 being refreshed more often than data portion 134 of DRAM 130. In some embodiments, the value of the second refresh rate may be changed during operation, such as during operation of the system 100 (see block 524 below). For such embodiments, during a first iteration of method 500 the determination in block 512 of the second refresh rate may be a determination and/or setting of an initial value for the second refresh rate. For such embodiments, the initial value of the second refresh rate may be a determined as a ratio to the first refresh rate, such as 1.4:1, 1.5:1, etc.

Alternatively or additionally, the second refresh rate determined in block 512—whether as an initial value or as an adjustment to the initial value during operation—may be determined based at least in part on calibration data as described above with reference to FIG. 1. In block 412 the calibration data for the parity region 132 used to determine the second, and such calibration data may be gathered by calibration tests performed on DRAM 130 while the SoC 102 is coupled to the DRAM 130 using method 400 as described above with reference to FIG. 4. The calibration data gathered may correspond to the calibration data discussed above, and the SoC 102 (or the refresh module 122 of SoC 102) may determine the second refresh rate as described above with reference to FIG. 1. For example, the calibration data may be indexed in a LUT and determining the second refresh rate may include accessing, by the SoC 102 (or refresh module 122), the LUT to select a second refresh rate associated with the desired or acceptable error rate for the parity region 132 (e.g. zero or an insignificant number of errors) for the error correction scheme.

Additionally or alternatively, the calibration data initially gathered before operation of DRAM 130 in a system 100 (see FIG. 1) or computing device may be augmented and/or replaced by data gathered and logged during the operation of DRAM 130. For example, as discussed below for block 524 during read operations from DRAM 130 ECC module 140 may perform error correction on data read from data region 134 and/or parity region 132. ECC module 140 may log, or cause to be logged, any detected memory errors in parity region 132 that is being refreshed at the second refresh rate.

This information may be used to augment the previously-gathered calibration data (e.g. add to the data set of errors at the second refresh rate) or to replace the previously-gathered calibration data (e.g. update the LUT for that refresh rate) such that subsequent determinations at block 512 of the second refresh rate take into account any changes or updates to the number of memory errors at a particular refresh rate.

Regardless of how determined in block 512, setting a second refresh rate for the smaller parity region 132 of DRAM allows over-refreshing of parity region 132 to ensure zero or no expected memory errors. Such over-refreshing in turn allows the error correction of ECC module 140 to focus entirely on data region 134 of DRAM 130, resulting in stronger error protection from memory errors for data region 134, without the power consumption of a higher refresh rate for the larger data region 134.

Returning to FIG. 5, method 500 continues to block 514 and determines or generates, such as with ECC module 140 of SoC 102, parity data for each write operation to DRAM 130. As discussed above, during operation the SoC 102 may perform write operations to an external DRAM 130 coupled to the SoC 102 via memory access channel 124. For example, a write operation may include writing user data payloads (UDP 214A-214N) to a data region 134 of DRAM 130 in a first transaction across the access channel 124. At block 514 parity data, such as parity bits 212A-212N (FIG. 2A) of a modified Hamming code, are generated by ECC module 140 for each UDP 214A-214N written to DRAM 130.

Continuing to block 516, the parity data generated in block 412 may be combined and/or concatenated into one or more parity words 220 (FIG. 2B). Each parity word 220 corresponds to parity data for multiple UDPs 214A-214N (e.g., multiple write operations from SoC 102 to DRAM 130). Reducing a number of parity data transactions from SoC 102 to DRAM 130 across the memory access channel 124 may improve performance by freeing the access channel 124 to perform user data transactions. As a result, depending on the operational mode of the SoC 102, the one or more parity words 220 generated in block 516 are not immediately written to parity region 132 of DRAM 130. Instead, the parity words 220 are initially cached on the SoC 102 in block 516, such as in ECC cache 142 of ECC module 140 (FIG. 1). Note however, that depending on the operational mode of SoC 102 (as discussed above), the parity words 220 generated in block 516 may not be initially cached on the SoC 102 in some embodiments, but instead may be immediately written to the parity region 132 of DRAM 130.

Method 500 includes refreshing the data region 134 of DRAM 130 at the first refresh rate at block 518. Such refreshing may be performed by refresh module 122, which as discussed above may be on a separate power island from the rest of SoC 102 to allow continued refreshing of DRAM 130 while the SoC 102 is in a low power mode such as a sleep mode. In addition, the DRAM 130 will also be able to self-refresh itself without any assistance from the SoC 102 after being placed into the self-refresh mode.

Method 500 includes selectively writing the one or more parity words 220 to the parity region 132 of DRAM at block 520. In some embodiments, the SoC 102 may be configured selectively write parity data (e.g., the one or more parity words 220) to parity region 132 of DRAM 130. For example, the SoC 102 may be configured to write parity data from the ECC cache 142 to DRAM 130 when the SoC 102 is about to change from the first active mode to a power saving mode. Additionally or alternatively, the SoC 102 may be configured to write parity data from the ECC cache 142 to DRAM 130 when the ECC cache 142 is full and/or new parity data replaces parity data in the ECC cache 142 that is no longer being used. Similarly, processor 106 may periodically or occasionally write cached parity data back to DRAM 130 to synchronize parity data.

Once parity data is written to the parity region 132 of DRAM 130, the method 500 refreshes the parity region 132 at the second refresh rate in 522. As discussed, the second refresh rate is different from the first refresh rate. Typically, the second refresh rate will be faster than the first refresh rate, resulting in over-refreshing the parity region 132 of DRAM 130. In embodiments where the second refresh rate may not change during operation, method 500 may return at this point.

In other embodiments, where the second refresh rate may change during operation, method 500 includes a determination whether a change to the second refresh rate is needed at block 524. Such determination may be made in an implementation at a pre-determined interval, such as a time interval or after a pre-determined number of writes to one or more region 132, 134 of DRAM 130 (or reads from DRAM 130). In other implementations, the determination of block 524 may be made in the event a read operation from DRAM 130 results in a memory error for parity region 132 of DRAM 130. For example, during a read operation from DRAM 130, ECC module 140 may perform error correction on the data read. A detected memory error for parity region 132 may result in a determination that a change is needed to the second refresh rate.

In yet other implementations, a determination that a change in the second refresh is needed may be caused by the ECC module 140 implementing a different level, degree, or type of error correction (e.g., moving from SEC-DED error correction to DEC-TED error correction or vice-versa). Regardless of how made, if there is a determination (or signal) that such change to second refresh rate is needed, method 500 continues to block 512 which operates as discussed above to determine a new second refresh rate for the parity region 132 of DRAM 130.

Although not illustrated in FIG. 5, in some embodiments, a new first refresh rate for data region 134 may also be (or instead) be set or determined. Such change to the first refresh rate may be needed for (or caused) by similar reasons as the change in the second refresh rate (e.g., in response to a detection of memory errors for data region 134 in excess of a threshold or in excess of an acceptable number of memory errors, or in response to the ECC module 140 implementing a different level or type of error correction).

In addition to refresh operations performed by refresh module 122, DRAM 130 may also be commanded to enter self-refresh during which the DRAM 130 may autonomously take control and perform refresh of itself without assistance from the SoC 102. This allows the SoC to also power down the refresh module 122. The DRAM 130 contains its own self-refresh logic (not shown) which internally and periodically performs self-refresh of the entire memory. There may be a first self-refresh logic which can perform refresh of the data region 134 at a first refresh rate, and there may be a second self-refresh logic which can perform refresh of the parity region 132 at a second refresh rate. The operations performed may be similar to that of the refresh module 122 except that they are self-contained within the DRAM 130.

DRAM 130 may be comprised of multiple DRAM devices to create a larger memory. In these cases, the parity region 132 and data region 134 may be partitioned using several methods. In one method, the smaller parity region 132 may be entirely restricted to one device while the data region 134 can reside in all devices. In another method, the parity region 132 may be distributed across all devices and the data region also distributed across all devices.

Figure 6:
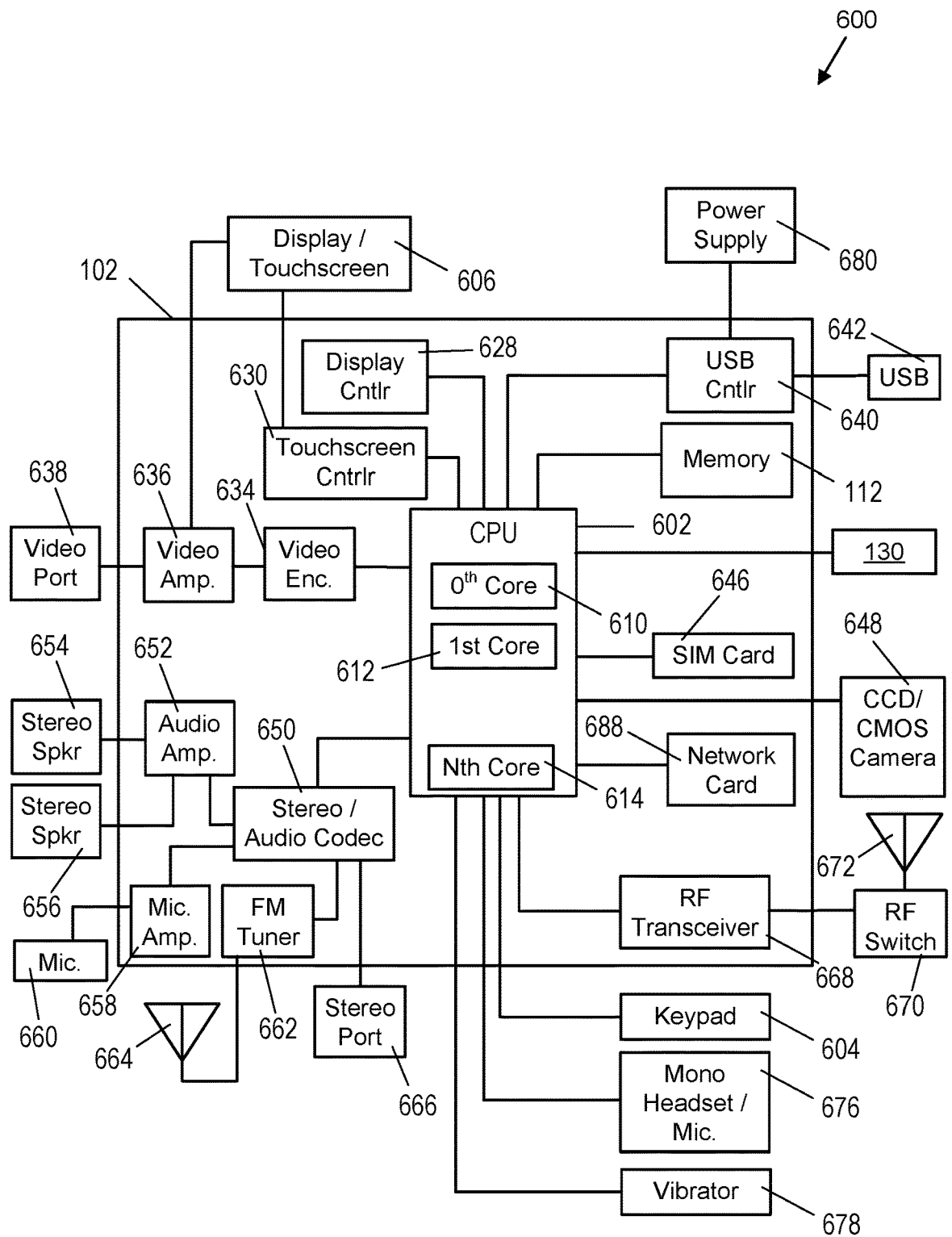
FIG. 6 is a block diagram of an exemplary computing device in which the system of FIG. 1 or method of FIGS. 4-5 may be implemented.

System 100 (FIG. 1) as well as methods 400 (FIG. 4) and/or 500 (FIG. 5) may be incorporated into or performed by any desired computing device or computing system. FIG. 6 illustrates the system 100 incorporated in an exemplary portable computing device (PCD) 600. In this embodiment, the SoC 102 may include a multicore CPU 602. The multicore CPU 602 may include a zeroth core 610, a first core 612, and an Nth core 614. One of the cores may comprise, for example, a graphics processing unit (GPU) with one or more of the others comprising the CPU.

A display controller 628 and a touch screen controller 630 may be coupled to the CPU 602. In turn, the touch screen display 606 external to the on-chip system 102 may be coupled to the display controller 628 and the touch screen controller 630. FIG. 6 further shows that a video encoder 634, e.g., a phase alternating line (PAL) encoder, a sequential color a memoire (SECAM) encoder, or a national television system(s) committee (NTSC) encoder, is coupled to the multicore CPU 602. Further, a video amplifier 636 is coupled to the video encoder 634 and the touch screen display 606.

Also, a video port 638 is coupled to the video amplifier 636. As shown in FIG. 6, a universal serial bus (USB) controller 640 is coupled to the multicore CPU 602. Also, a USB port 642 is coupled to the USB controller 640. Memory 112 and a subscriber identity module (SIM) card 646 may also be coupled to the multicore CPU 602. A digital camera 648 may be coupled to the multicore CPU 602. In an exemplary aspect, the digital camera 648 is a charge-coupled device (CCD) camera or a complementary metal-oxide semiconductor (CMOS) camera.

As further illustrated in FIG. 6, a stereo audio coder-decoder (CODEC) 650 may be coupled to the multicore CPU 602. Moreover, an audio amplifier 652 may be coupled to the stereo audio CODEC 650. In an exemplary aspect, a first stereo speaker 654 and a second stereo speaker 656 are coupled to the audio amplifier 652. FIG. 6 shows that a microphone amplifier 658 may be also coupled to the stereo audio CODEC 650. Additionally, a microphone 660 may be coupled to the microphone amplifier 658. In a particular aspect, a frequency modulation (FM) radio tuner 662 may be coupled to the stereo audio CODEC 650. Also, an FM antenna 664 is coupled to the FM radio tuner 662. Further, stereo headphones 666 may be coupled to the stereo audio CODEC 650.

FIG. 6 further illustrates that a radio frequency (RF) transceiver 668 may be coupled to the multicore CPU 602. An RF switch 670 may be coupled to the RF transceiver 668 and an RF antenna 672. A keypad 604 may be coupled to the multicore CPU 602. Also, a mono headset with a microphone 676 may be coupled to the multicore CPU 602. Further, a vibrator device 678 may be coupled to the multicore CPU 602.

FIG. 6 also shows that a power supply 680 may be coupled to the on-chip system 102. In a particular aspect, the power supply 680 is a direct current (DC) power supply that provides power to the various components of the PCD 600 that require power. Further, in a particular aspect, the power supply is a rechargeable DC battery or a DC power supply that is derived from an alternating current (AC) to DC transformer that is connected to an AC power source.

PCD 600 may also include a network card 688 that may be used to access a data network, e.g., a local area network, a personal area network, or any other network. The network card 688 may be a Bluetooth network card, a WiFi network card, a personal area network (PAN) card, a personal area network ultra-low-power technology (PeANUT) network card, a television/cable/satellite tuner, or any other network card well known in the art. Further, the network card 688 may be incorporated into a chip, i.e., the network card 688 may be a full solution in a chip, and may not be a separate network card 688.

Memory 130, touch screen display 606, the video port 638, the USB port 642, the camera 648, the first stereo speaker 654, the second stereo speaker 656, the microphone 660, the FM antenna 664, the stereo headphones 666, the RF switch 670, the RF antenna 672, the keypad 674, the mono headset 676, the vibrator 678, and the power supply 680 may be external to the on-chip system 102 or "off chip."

It should be appreciated that one or more of the method steps described herein may be stored in the memory as computer programs. These programs may be executed by any suitable processor in combination or in concert with the corresponding module to perform the methods described herein.

Certain steps in the processes or process flows described in this specification naturally precede others for the invention to function as described. However, the invention is not limited to the order of the steps or blocks described if such order or sequence does not alter the functionality of the invention. That is, it is recognized that some steps or blocks may performed before, after, or parallel (substantially simultaneously with) other steps or blocks without departing from the scope and spirit of the invention. For example, blocks 510 and 512 of method 500 may take place at the same time rather than sequentially as illustrated in FIG. 5. Similarly, depending on the implementation and the operational status, block 520 may occur before block 518 in method 500, or block 518 may occur multiple times before an occurrence of block 520.

In some instances, certain steps or blocks may be omitted or not performed without departing from the invention. For example, as noted, block 524 of method 500 may be optional in some embodiments. Further, words such as "thereafter", "then", "next", etc. are not intended to limit the order of the steps. These words are simply used to guide the reader through the description of the exemplary method.

Additionally, one of ordinary skill in programming is able to write computer code or identify appropriate hardware and/or circuits to implement the disclosed invention without difficulty based on the flow charts and associated description in this specification, for example.

Therefore, disclosure of a particular set of program code instructions or detailed hardware devices is not considered necessary for an adequate understanding of how to make and use the invention. The inventive functionality of the claimed computer implemented processes is explained in more detail in the above description and in conjunction with the Figures which may illustrate various process flows.

In one or more exemplary aspects, the functions described may be implemented in hardware, software, firmware, or any combination thereof. If implemented in software, the functions may be stored on or transmitted as one or more programs on a computer-readable medium. Computer-readable media include both computer storage media and communication media including any medium that facilitates transfer of a computer program from one place to another. A storage media may be any available media that may be accessed by a computer. By way of example, and not limitation, such computer-readable media may comprise RAM, ROM, EEPROM, NAND flash, NOR flash, M-RAM, P-RAM, R-RAM, CD-ROM or other optical disk storage, magnetic disk storage or other magnetic storage devices, or any other medium that may be used to carry or store desired program code in the form of instructions and/or data structures and that may be accessed by a computer.

Also, any connection is properly termed a computer-readable medium. For example, if the software is transmitted from a website, server, or other remote source using a coaxial cable, fiber optic cable, twisted pair, digital subscriber line ("DSL"), or wireless technologies such as infrared, radio, and microwave, then the coaxial cable, fiber optic cable, twisted pair, DSL, or wireless technologies such as infrared, radio, and microwave are included in the definition of medium.

Disk and disc, as used herein, includes compact disc ("CD"), laser disc, optical disc, digital versatile disc ("DVD"), floppy disk and blu-ray disc where disks usually reproduce data magnetically, while discs reproduce data optically with lasers. Combinations of the above should also be included within the scope of computer-readable media.

Alternative embodiments will become apparent to one of ordinary skill in the art to which the invention pertains without departing from its spirit and scope. Therefore, although selected aspects have been illustrated and described in detail, it will be understood that various substitutions and alterations may be made therein without departing from the spirit and scope of the present invention, as defined by the following claims.

What is claimed is:

1. A method for implementing error correction control (ECC) on a computing device, the method comprising:
    defining a parity region and a user data region of a refreshable memory device, the memory device coupled to a system on a chip (SoC), the parity region having a size which is smaller than the user data region, the parity region storing ECC parity bits without user payload data (UPD), the user data region storing user payload data without ECC parity bits;
    determining with the SoC a first refresh rate for the user data region of the memory device;
    determining with the SoC a second refresh rate for the parity region of the memory device, the second refresh rate being greater than the first refresh rate and being based on at least one of: a ratio to the first refresh rate, and calibration data;
    generating with the SoC parity data for a write operation of the user payload data (UPD) to the user data region of the memory device;
    refreshing the user data region of the memory device at the first refresh rate;
    refreshing the parity region of the memory device at the second refresh rate; and
    determining that a change in the second refresh rate for the parity region is needed based on at least one of: a time interval, a pre-determined number of writes to the parity region or user data region, error detection in the parity region, and a change in type of error correction.

2. The method of claim 1, wherein the refreshable memory device comprises a dynamic random access memory (DRAM).

3. The method of claim 2, wherein the parity region of the DRAM comprises a plurality of sequential memory addresses of the DRAM and the user data region of the DRAM comprises a second plurality of sequential memory addresses of the DRAM.

4. The method of claim 1, further comprising:
    storing the generated parity data in an ECC cache of the SoC; and
    writing the generated parity data stored in the ECC cache to the parity region of the memory device at a different time than the associated user data is provided to the user data region of the memory device.

5. The method of claim 4, wherein the generated parity data comprises one or more parity words having a length corresponding to a word-length of the memory device, the one or more parity words including parity bits for multiple write operations from the SoC to the memory device.

6. The method of claim 5, further comprising:
    writing one or more of the parity words from the ECC cache to the parity region of the memory device.

7. The method of claim 1, wherein the calibration data is generated by calibration tests performed on the memory device while the memory device is coupled to the SoC, wherein the calibration data corresponds to the number of memory errors detected at different refresh rates under varying conditions of the memory device.

8. The method of claim 1, further comprising:
    during operation of the SoC, changing the second refresh rate for the parity region of the refreshable memory to a third refresh rate, the third refresh rate different from the first refresh rate.

9. A computer system for implementing error correction control (ECC), the system comprising:
    a refreshable memory device, the memory device comprising a parity region and a user data region, the parity region having a size which is smaller than the user data region, the parity region storing ECC parity bits without user payload data (UPD), the user data region storing user payload data without ECC parity bits;
    a system on a chip (SoC) in communication with the memory device; and
    logic of the SoC configured to:
        determine a first refresh rate for the user data region of the memory device;
        determine a second refresh rate for the parity region of the memory device, the second refresh rate being greater than the first refresh rate and being based on at least one of: a ratio to the first refresh rate, and calibration data;
        generate parity data for a write operation of the user payload data (UPD) to the user data region of the memory device;
        refresh the user data region of the memory device at the first refresh rate;
        refresh the parity region of the memory device at the second refresh rate; and
        determining that a change in the second refresh rate for the parity region is needed based on at least one of: a time interval, a pre-determined number of writes to the parity region or user data region, error detection in the parity region, and a change in type of error correction.

10. The system of claim 9, wherein the refreshable memory device comprises a dynamic random access memory (DRAM).

11. The system of claim 10, wherein the parity region of the DRAM comprises a plurality of sequential memory addresses of the DRAM and the user data region of the DRAM comprises a second plurality of sequential memory addresses of the DRAM.

12. The system of claim 9, wherein the SoC further comprises an ECC module with an ECC cache, the ECC module configured to store the generated parity data in the ECC cache and to write the generated parity data stored in the ECC cache to the parity region of the memory device at a different time than the associated user data is provided to the user data region of the memory device.

13. The system of claim 12, wherein the generated parity data comprises one or more parity words having a length corresponding to a word-length of the memory device, the one or more parity words including parity bits for multiple write operations from the SoC to the memory device.

14. The system of claim 13, wherein the logic is further configured to:
 write one or more of the parity words from the ECC cache to the parity region of the memory device.

15. The system of claim 9, wherein the calibration data is generated by calibration tests performed on the memory device while the memory device is coupled to the SoC, wherein the calibration data corresponds to the number of memory errors detected at different refresh rates under varying conditions of the memory device.

16. The system of claim 9, wherein the logic of the SoC is further configured to:
 during operation of the SoC, changing the second refresh rate for the parity region of the refreshable memory to a third refresh rate, the third refresh rate different from the first refresh rate.

17. A computer program product comprising a non-transitory computer usable medium having a computer readable program code embodied therein, said computer readable program code adapted to be executed to implement a method for implementing error correction control (ECC) on a computing device, the method comprising:
 defining a parity region and a user data region of a refreshable memory device, the memory device coupled to a system on a chip (SoC), the parity region having a size which is smaller than the user data region, the parity region storing ECC parity bits without user payload data (UPD), the user data region storing user payload data without ECC parity bits;
 determining with the SoC a first refresh rate for the user data region of the memory device;
 determining with the SoC a second refresh rate for the parity region of the memory device, the second refresh rate being greater than the first refresh rate and being based on at least one of: a ratio to the first refresh rate, and calibration data;
 generating parity data for a write operation of the user payload data (UPD) to the user data region of the memory device;
 refreshing the user data region of the memory device at the first refresh rate;
 refreshing the parity region of the memory device at the second refresh rate; and
 determining that a change in the second refresh rate for the parity region is needed based on at least one of: a time interval, a pre-determined number of writes to the parity region or user data region, error detection in the parity region, and a change in type of error correction.

18. The computer program product of claim 17, wherein the refreshable memory device comprises a dynamic random access memory (DRAM).

19. The computer program product of claim 18, wherein the parity region of the DRAM comprises a plurality of sequential memory addresses of the DRAM and the user data region of the DRAM comprises a second plurality of sequential memory addresses of the DRAM.

20. The computer program product of claim 17, further comprising:
 storing the generated parity data in an ECC cache of the SoC; and
 writing the generated parity data stored in the ECC cache to the parity region of the memory device at a different time than the associated user data is provided to the user data region of the memory device.

21. The computer program product of claim 20, wherein the generated parity data comprises one or more parity words having a length corresponding to a word-length of the memory device, the one or more parity words including parity bits for multiple write operations from the SoC to the memory device.

22. The computer program product of claim 21, further comprising:
 writing one or more of the parity words from the ECC cache to the parity region of the memory device.

23. The computer program product of claim 17, wherein the calibration data is generated by calibration tests performed on the memory device while the memory device is coupled to the SoC, the calibration tests comprising logging a number of memory errors at different refresh rates under varying conditions of the memory device.

24. A computer system for implementing error correction control (ECC) on a computing device, the system comprising:
 means for defining a parity region and a user data region of a refreshable memory device, the parity region having a size which is smaller than the user data region, the parity region storing ECC parity bits without user payload data (UPD), the user data region storing user payload data without ECC parity bits, the memory device coupled to a system on a chip (SoC);
 means for determining with the SoC a first refresh rate for the user data region of the memory device;
 means for determining with the SoC a second refresh rate for the parity region of the memory device, the second refresh rate being greater than the first refresh rate and being based on at least one of: a ratio to the first refresh rate, and calibration data;
 means for generating parity data for a write operation of the user payload data (UPD) to the user data region of the memory device;
 means for refreshing the user data region of the memory device at the first refresh rate;
 means for refreshing the parity region of the memory device at the second refresh rate; and
 means for determining that a change in the second refresh rate for the parity region is needed based on at least one of: a time interval, a pre-determined number of writes to the parity region or user data region, error detection in the parity region, and a change in type of error correction.

25. The system of claim 24, wherein the parity region of the DRAM comprises a plurality of sequential memory addresses of the DRAM and the user data region of the DRAM comprises a second plurality of sequential memory addresses of the DRAM.

26. The system of claim 24, further comprising:
 means for storing the generated parity data in an ECC cache of the SoC; and
 means for writing the generated parity data stored in the ECC cache to the parity region of the memory device at a different time than the associated user data is provided to the user data region of the memory device.

27. The system of claim 26, wherein the generated parity data comprises one or more parity words having a length corresponding to a word-length of the memory device, the one or more parity words including parity bits for multiple write operations from the SoC to the memory device.

28. The system of claim 27, further comprising:
means for writing one or more of the parity words from the ECC cache to the parity region of the memory device.

29. The system of claim 28, wherein the calibration data is generated by calibration tests performed on the memory device while the memory device is coupled to the SoC, the calibration tests comprising logging a number of memory errors at different refresh rates under varying conditions of the memory device.

* * * * *